(12) United States Patent
Hsiang et al.

(10) Patent No.: US 10,636,835 B2
(45) Date of Patent: Apr. 28, 2020

(54) LIGHT EMITTING DIODE DISPLAY AND FABRICATING METHOD THEREOF

(71) Applicant: Acer Incorporated, New Taipei (TW)

(72) Inventors: Jui-Chieh Hsiang, New Taipei (TW); Hsu-Hsiang Tseng, New Taipei (TW); Chih-Chiang Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 16/045,751

(22) Filed: Jul. 26, 2018

(65) Prior Publication Data

US 2018/0337212 A1 Nov. 22, 2018

Related U.S. Application Data

(62) Division of application No. 15/596,763, filed on May 16, 2017, now abandoned.

(30) Foreign Application Priority Data

Jan. 26, 2017 (TW) .............................. 106103084 A (51) Int. Cl.
| | | |
|---|---|---|
| *H01L 27/15* | (2006.01) | |
| *H01L 25/075* | (2006.01) | |
| *H01L 33/54* | (2010.01) | |
| *H01L 33/00* | (2010.01) | |
| *H01L 33/62* | (2010.01) | |
| *H01L 25/16* | (2006.01) | |

(52) U.S. Cl.
CPC .......... *H01L 27/15* (2013.01); *H01L 25/0753* (2013.01); *H01L 25/167* (2013.01); *H01L 27/156* (2013.01); *H01L 33/0079* (2013.01); *H01L 33/54* (2013.01); *H01L 33/62* (2013.01); *H01L 2933/005* (2013.01); *H01L 2933/0033* (2013.01); *H01L 2933/0066* (2013.01)

(58) Field of Classification Search
CPC ........ H01L 33/44; H01L 33/62; H01L 33/405
See application file for complete search history.

(56) References Cited

U.S. PATENT DOCUMENTS

| | | |
|---|---|---|
| 2008/0173884 A1 | 7/2008 | Chitnis |
| 2009/0159870 A1 | 6/2009 | Lin et al. |
| 2015/0129908 A1 | 5/2015 | Kobayakawa et al. |
| 2015/0249197 A1 | 9/2015 | Shieh et al. |
| 2016/0087165 A1 | 3/2016 | Lee |

(Continued)

FOREIGN PATENT DOCUMENTS

| | | |
|---|---|---|
| TW | 200414498 | 8/2004 |
| TW | 200824114 | 6/2008 |

(Continued)

*Primary Examiner* — Changhyun Yi
(74) *Attorney, Agent, or Firm* — JCIPRNET (57) ABSTRACT

A light emitting diode display including at least one light emitting diode chip is provided. The light emitting diode chip includes a first substrate, a plurality of light emitting diodes, a first insulation layer and a plurality of switch devices. The plurality of light emitting diodes are disposed on the first substrate. The first insulation layer covers the plurality of light emitting diodes. The plurality of switch devices are disposed on the first insulation layer and electrically connected to the plurality of light emitting diodes. Moreover, a fabricating method of the light emitting diode display is also provided.

3 Claims, 9 Drawing Sheets

(56) References Cited

U.S. PATENT DOCUMENTS

| | | |
|---|---|---|
| 2016/0126293 A1 | 5/2016 | Li et al. |
| 2016/0163765 A1* | 6/2016 | Hu ..................... H01L 27/156 257/93 |
| 2016/0293586 A1 | 10/2016 | Ghosh |
| 2017/0338210 A1* | 11/2017 | Kim ..................... H01L 27/15 |

FOREIGN PATENT DOCUMENTS

| | | |
|---|---|---|
| TW | 201025558 | 7/2010 |
| TW | 201203504 | 1/2012 |
| TW | 201301565 | 1/2013 |

* cited by examiner

LIGHT EMITTING DIODE DISPLAY AND FABRICATING METHOD THEREOF

CROSS-REFERENCE TO RELATED APPLICATION

This application is a divisional of and claims the priority benefit of U.S. application Ser. No. 15/596,763, filed on May 16, 2017, now pending, which claims the priority benefit of Taiwan application serial no. 106103084, filed on Jan. 26, 2017. The entirety of each of the above-mentioned patent applications is hereby incorporated by reference herein and made a part of specification.

BACKGROUND OF THE INVENTION

Field of the Invention

The invention relates to a display and a fabricating method thereof, and particularly relates to a light emitting diode display and a fabricating method thereof.

Description of Related Art

A light emitting diode display includes a plurality of light emitting diodes and a drive circuit substrate with a switch device. In a manufacturing process of the light emitting diode display, the plurality of light emitting diodes are required to be transferred onto the drive circuit substrate, and the plurality of light emitting diodes are electrically connected to the drive circuit substrate. The method of transposing the light emitting diodes includes a mass transfer method and a wafer transfer method. The mass transfer method is to dispose the plurality of light emitting diodes on a growth substrate onto the drive circuit substrate using a flexible transferring head. However, the flexible transferring head needs to have a special structural design and perform picking up and disposing actions several times to complete the transposition of the light emitting diodes. Additionally, the flexible transferring head which have pick up the light emitting diodes and the drive circuit substrate need to be precisely aligned with each other, which affects the yield of light emitting diode display. The wafer transfer method is to transfer the wafer and the plurality of light emitting diodes grown on the wafer onto the drive circuit substrate together, and the plurality of light emitting diodes on the wafer are electrically connected to the drive circuit substrate. However, after the plurality of light emitting diodes on the wafer are electrically connected to the drive circuit substrate, the wafer (e.g., sapphire substrate) needs to be removed, so that the yield of the light emitting diode display is low.

SUMMARY OF THE INVENTION

The invention provides a light emitting diode display and a fabricating method thereof with high yield.

The invention provides a light emitting diode display including at least one light emitting diode chip. Each of the light emitting diode chips includes a first substrate, a plurality of light emitting diodes disposed on the first substrate, a first insulation layer covering the plurality of light emitting diodes and a plurality of switch devices disposed on the first insulation layer and electrically connected to the plurality of light emitting diodes.

According to an embodiment of the invention, the first insulation layer has a plurality of first contact holes exposing the plurality of light emitting diodes. The plurality of switch devices are electrically connected to the plurality of light emitting diodes via the plurality of first contact holes.

According to an embodiment of the invention, each of the light emitting diodes includes a first type semiconductor layer, a second type semiconductor layer opposite to the first type semiconductor layer and a light emitting layer located between the first type semiconductor layer and the second type semiconductor layer. The switch devices are electrically connected to a plurality of the first type semiconductor layers of the plurality of light emitting diodes via the plurality of first contact holes.

According to an embodiment of the invention, each of the light emitting diode chips further includes a plurality of conductive patterns. The plurality of conductive patterns are disposed on the first insulation layer. The first insulation layer further has a plurality of second contact holes exposing the light emitting diodes and being separated from the first contact holes. The conductive patterns are electrically connected to the second type semiconductor layers of the light emitting diodes via the second contact holes.

According to an embodiment of the invention, the first substrate has a groove, and the light emitting diodes are disposed in the groove.

According to an embodiment of the invention, each of the light emitting diode chips further includes a second substrate. The light emitting diodes are formed on the second substrate. The second substrate and the light emitting diodes are disposed on the first substrate, and the second substrate is located between the light emitting diodes and the first substrate.

According to an embodiment of the invention, the first substrate has a groove, and the second substrate and the light emitting diodes are disposed in the groove.

According to an embodiment of the invention, the first insulation layer completely covers the first substrate.

According to an embodiment of the invention, the first insulation layer partially covers the first substrate.

According to an embodiment of the invention, two adjacent light emitting diodes have a gap therebetween, such that the plurality of light emitting diodes are separated from each other. The gap corresponds to a portion of the first substrate, and the first insulation layer uncovers the portion of the first substrate.

According to an embodiment of the invention, each of the light emitting diode chips further includes a second insulation layer covering the switch devices.

According to an embodiment of the invention, each of the light emitting diode chips further includes a third substrate covering the second insulation layer.

The invention provides a fabricating method of a light emitting diode display including the following steps. A first substrate and a plurality of light emitting diodes disposed on the first substrate are provided. A first insulation layer is formed to cover the light emitting diodes. A plurality of switch devices are formed on the first insulation layer. The switch devices are electrically connected to the light emitting diodes.

According to an embodiment of the invention, the fabricating method of the light emitting diode display further includes the following steps. The plurality of light emitting diodes are formed on a second substrate. To make the second substrate and the light emitting diodes be disposed on the first substrate. The second substrate is located between the light emitting diodes and the first substrate.

According to an embodiment of the invention, the fabricating method of the light emitting diode display further includes the following steps. The plurality of light emitting diodes are formed on the second substrate. To make a third substrate pick up the light emitting diodes and the second substrate. The second substrate is removed. To make the third substrate dispose the light emitting diodes on the first substrate.

According to an embodiment of the invention, the fabricating method of the light emitting diode display further includes the following step. A second insulation layer is formed to cover the plurality of switch devices.

According to an embodiment of the invention, the fabricating method of the light emitting diode display further includes the following steps. To make the second insulation layer, the switch devices, the first insulation layer, the light emitting diodes and the first substrate be fixed on a fourth substrate. The second insulation layer is located between the fourth substrate and the first insulation layer. The first substrate is removed.

According to an embodiment of the invention, the fabricating method of the light emitting diode display further includes the following step. After the first substrate is removed, to make the fourth substrate and the second insulation layer be separated from each other.

Based on the above, in the fabricating method of the light emitting diode display of an embodiment of the invention, the insulation layer is formed on the substrate carrying the plurality of light emitting diodes to cover the plurality of light emitting diodes. Then, the plurality of switch devices electrically connected to the plurality of light emitting diodes are formed on the insulation layer. Thus, the light emitting diodes are not required to be transferred onto a drive circuit substrate with the switch device, thereby enhancing the yield of the light emitting diode display.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1A:
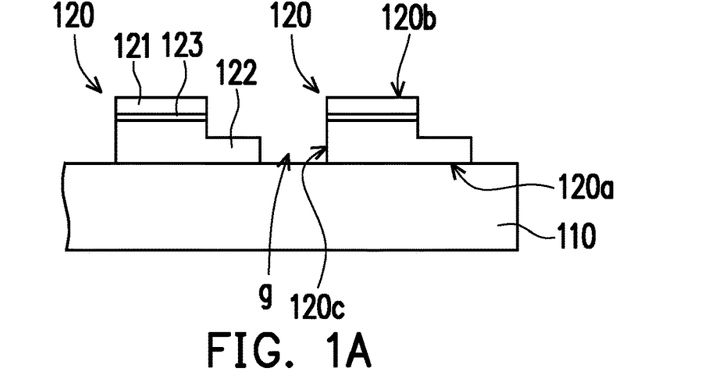
FIG. 1A to FIG. 1H are schematic cross-sectional views of a fabricating method of a light emitting diode display according to an embodiment of the invention.

FIG. 1A to FIG. 1H are schematic cross-sectional views of a fabricating method of a light emitting diode display according to an embodiment of the invention. Referring to FIG. 1A, first, a plurality of light emitting diodes 120 are formed on a second substrate 110. The light emitting diodes 120 are commonly referred to as micro light emitting diodes (Micro-LEDs). In the embodiment, the second substrate 110 may be a growth substrate (e.g., sapphire substrate). After the second substrate 110 is provided, epitaxial growth may be performed on the second substrate 110 to form a plurality of film layers (not shown) stacked to each other. Then, the plurality of film layers are patterned (i.e., to make an interior of the plurality of film layers has a gap g), thereby forming the plurality of light emitting diodes 120 separated from each other. Each of the light emitting diodes 120 has a lower surface 120a, an upper surface 120b opposite to the lower surface 120a and a sidewall 120c connected between the lower surface 120a and the upper surface 120b. The sidewall 120c is defined by the gap g. Each of the light emitting diodes 120 includes a first type semiconductor layer 121, a second type semiconductor layer 122 opposite to the first type semiconductor layer 121 and a light emitting layer 123 located between the first type semiconductor layer 121 and the second type semiconductor layer 122. In the embodiment, the first type semiconductor layer 121 is a P-type semiconductor layer, for example, and the second type semiconductor layer 122 is an N-type semiconductor layer, for example. However, the invention is not limited thereto. In other embodiments, the first type semiconductor layer 121 may also be an N-type semiconductor layer, and the second type semiconductor layer 122 may also be a P-type semiconductor layer.

Figure 1B:
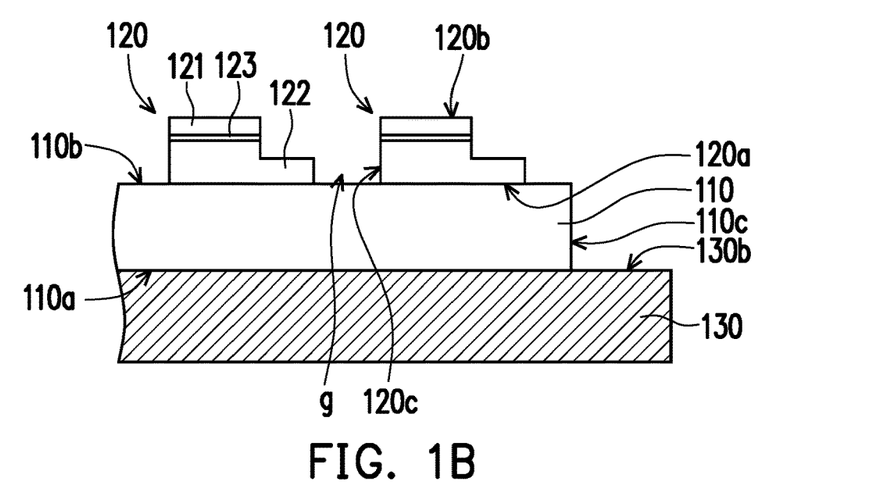

Referring to FIG. 1B, then, the second substrate 110 and the plurality of light emitting diodes 120 on the second substrate 110 may be disposed on a first substrate 130. At this time, the second substrate 110 is located between the plurality of light emitting diodes 120 and the first substrate 130, and the lower surface 120a of each of the light emitting diodes 120 faces the first substrate 130. The second substrate 110 has a lower surface 110a facing the first substrate 130, an upper surface 110b opposite to the lower surface 110a and a sidewall 110c connected between the lower surface 110a and the upper surface 110b. The gap g exposes a portion of the upper surface 110b of the second substrate 110. The first substrate 130 is mainly used to carry the light emitting diodes 120. A material of the first substrate 130 may be glass, quartz, organic polymers, or opaque/reflective materials (e.g., wafers, ceramics), or other appropriate materials.

Figure 1C:
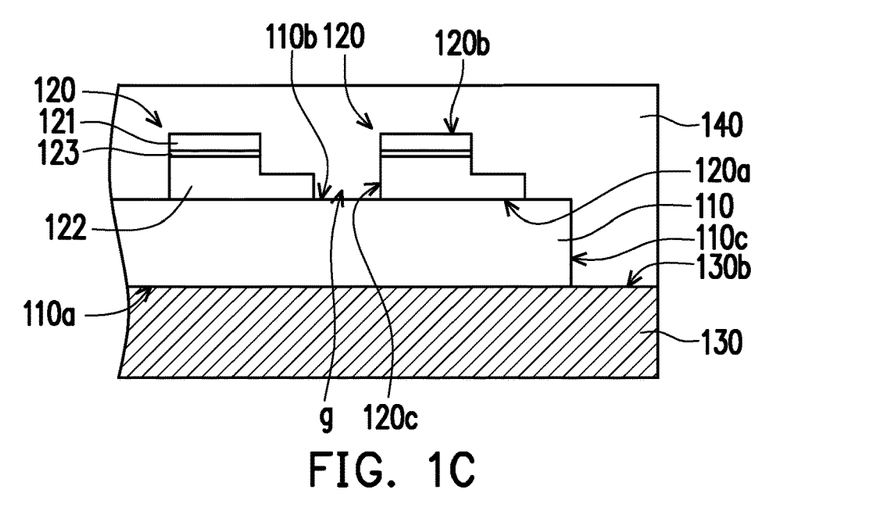

Referring to FIG. 1C, then, a first insulation layer 140 is formed to cover the plurality of light emitting diodes 120. A material of the first insulation layer 140 may be an inorganic material (e.g., silicon oxide, silicon nitride, silicon oxynitride, or a stacked layer of at least two of the above materials), an organic material, or a combination of an organic material and an inorganic material. In the embodiment, the first insulation layer 140 may completely cover the light emitting diodes 120, the second substrate 110 and the first substrate 130. Specifically, the first insulation layer 140 may cover the upper surface 120b of each of the light emitting diodes 120, the sidewall 120c of each of the light emitting diodes 120, the portion of the upper surface 110b of the second substrate 110 exposed by the gap g, the sidewall 110c of the second substrate 110 and the portion of the upper surface 130b of the first substrate 130. However, the invention is not limited thereto. In other embodiments, the first insulation layer 140 may not completely cover the first substrate 130 and/or the second substrate 110. The first insulation layer 140 may also partially cover the first substrate 130 and/or the second substrate 110. Hereinafter, the following paragraphs will illustrate with other drawings.

Figure 1D:
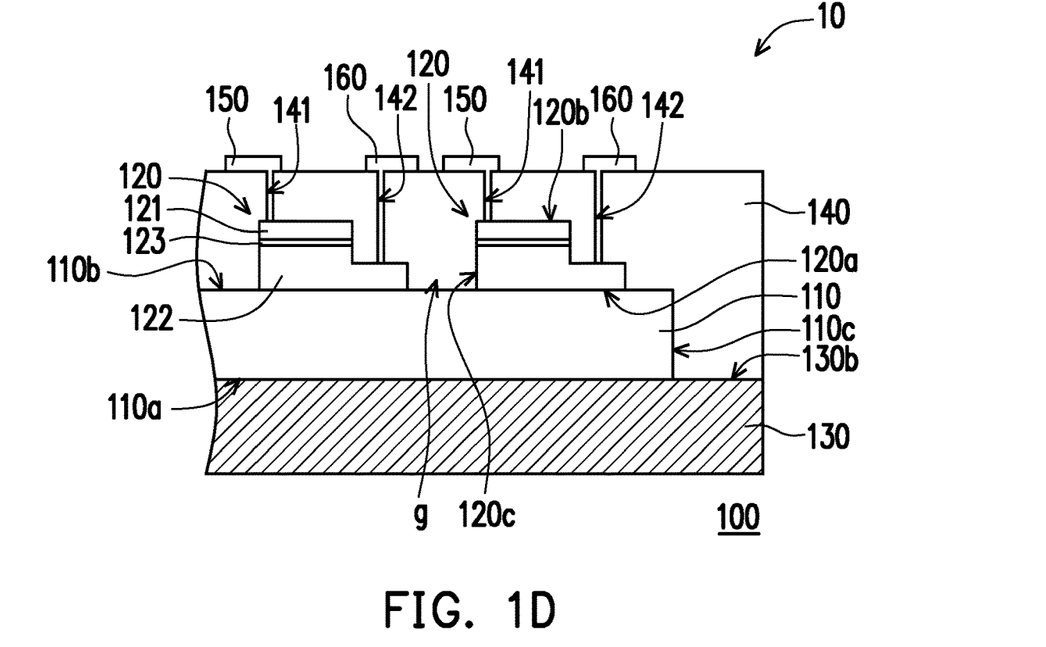

Referring to FIG. 1D, then, the first insulation layer 140 may be patterned to form a plurality of first contact holes 141. A portion of each of the light emitting diodes 120 is exposed by one corresponding first contact hole 141. In the embodiment, when the first contact holes 141 are formed, a plurality of second contact holes 142 may be further optionally formed simultaneously. The second contact holes 142 and the first contact holes 141 are separated from each other. Another portion of each of the light emitting diodes 120 may be exposed by one corresponding second contact hole 142.

Referring to FIG. 1D, then, a plurality of switch devices 150 are formed on the first insulation layer 140. The plurality of switch devices 150 are electrically connected to the plurality of light emitting diodes 120. The switch devices 150 are disposed on the first insulation layer 140. The switch devices 150 may be electrically connected to the light emitting diodes 120 via the first contact holes 141. Specifically, the switch devices 150 may be electrically connected to the first type semiconductor layers 121 of the light emitting diodes 120 via the first contact holes 141, but the invention is not limited thereto.

In the embodiment, the switch device 150 may be an active or passive switch device. To take the active switch device 150 as an example, the switch device 150 may include at least one thin film transistor, a scan line and a data line. A source of the thin film transistor is electrically connected to the data line, a gate of the thin film transistor is electrically connected to the scan line, and a drain of the thin film transistor is electrically connected to the light emitting diode 120. However, the invention is not limited thereto. In other embodiments, the active switch device 150 may further optionally include other electronic devices (e.g., capacitance) to enhance optical and/or electrical characteristics of the light emitting diode display 100. In short, as long as the switch device 150 can control the brightness of the light emitting diodes 120, the invention does not limit whether the switch device 150 is active or passive and does not limit the specific structure of the switch device 150. Whether the switch device 150 is active or passive and the specific structure thereof can be determined based on the actual needs.

Referring to FIG. 1D, in the embodiment, a plurality of conductive patterns 160 may be further formed on the first insulation layer 140. The conductive patterns 160 are disposed on the first insulation layer 140. The conductive patterns 160 may be electrically connected to the plurality of second type semiconductor layers 122 of the plurality of light emitting diodes 120 via the plurality of second contact holes 142. In the embodiment, the conductive patterns 160 may be grounded common electrodes, but the invention is not limited thereto. Additionally, in the embodiment, the conductive patterns 160 may be fabricated together with a portion of the switch devices 150 (e.g., the gate of the thin film transistor), but the invention is not limited thereto. In other embodiments, the conductive patterns 160 and the switch devices 150 may also be fabricated separately.

After the steps corresponding to FIG. 1A to FIG. 1D are completed, the light emitting diode display 100 including at least one light emitting diode chip 10 is initially completed. It should be note that, the steps corresponding to FIG. 1E, FIG. 1E to FIG. 1G, or FIG. 1E to FIG. 1H may be performed on the light emitting diode display 100 of FIG. 1D to form light emitting diode displays 100-1, 100-2, or 100-3. The following is described with reference to FIG. 1E to FIG. 1H. The light emitting diode displays 100-1, 100-2 and 100-3 and the fabricating methods thereof are within the scope of the invention.

Figure 1E:
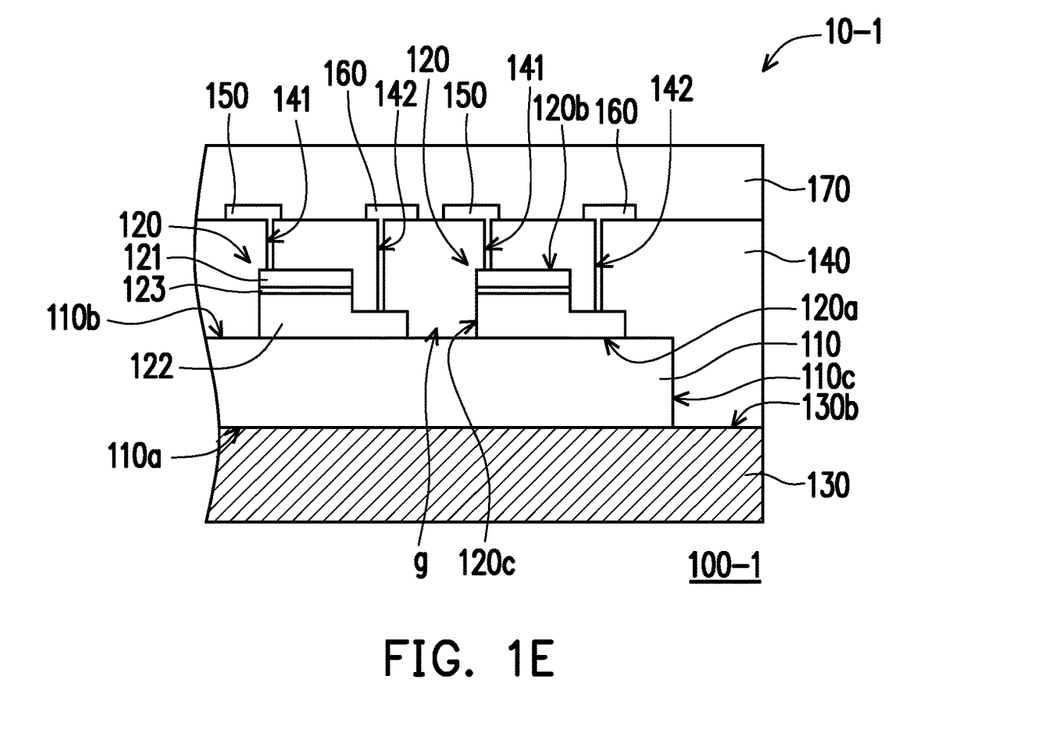

Referring to FIG. 1E, after the light emitting diode display 100 of FIG. 1D is completed, then, a second insulation layer 170 may be formed to cover the switch devices 150. In the embodiment, the second insulation layer 170 further covers the conductive patterns 160 and a portion of the first insulation layer 140. In the embodiment, a material of the second insulation layer 170 may be an inorganic material (e.g., silicon oxide, silicon nitride, silicon oxynitride, or a stacked layer of at least two of the above materials), an organic material, or a combination of an organic material and an inorganic material. The light emitting diode display 100-1 including at least one light emitting diode chip 10-1 of FIG. 1E further has the second insulation layer 170 compared with the light emitting diode display 100 of FIG. 1D.

Figure 1F:
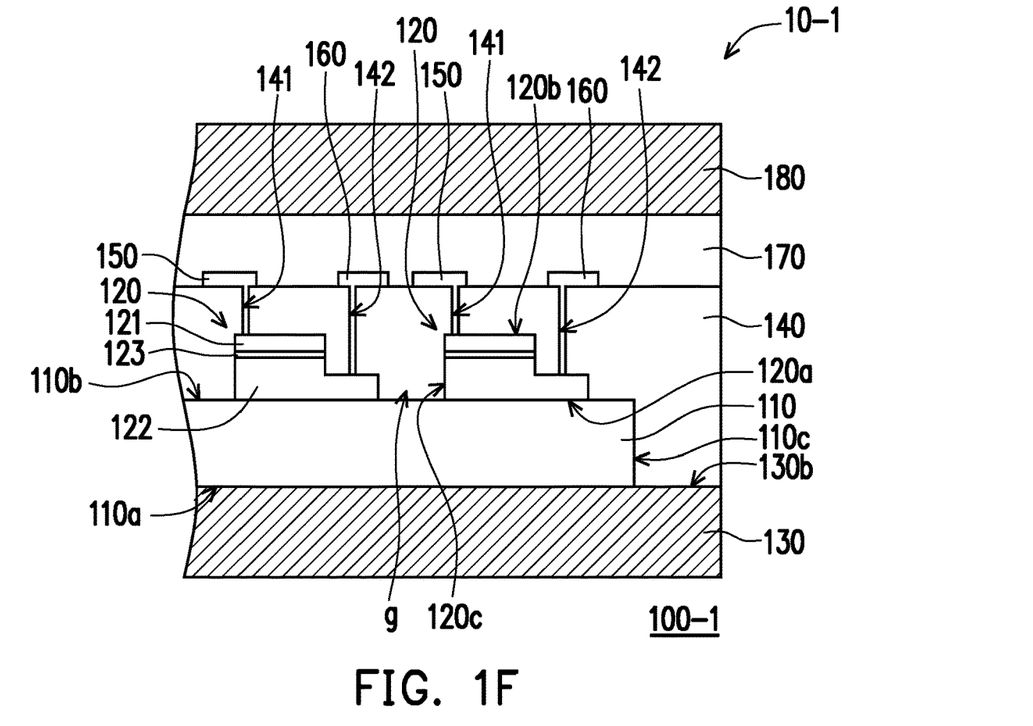
Figure 1G:
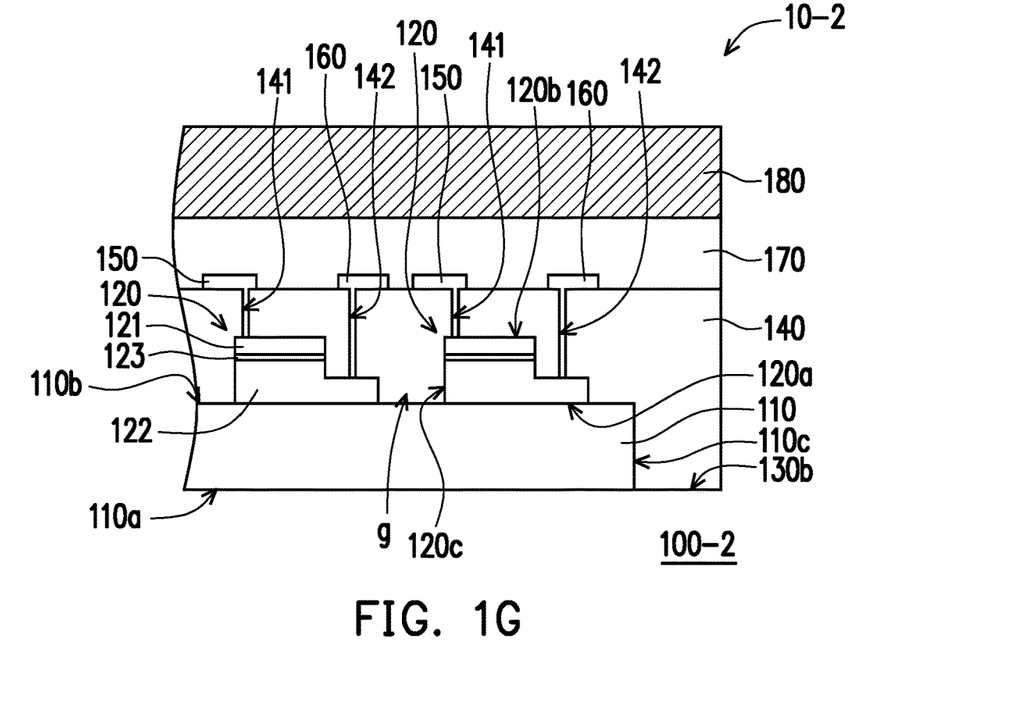

Referring to FIG. 1F, after the light emitting diode display 100-1 of FIG. 1E is completed, then, to make the second insulation layer 170, the switch devices 150, the conductive patterns 160, the first insulation layer 140, the light emitting diodes 120, the second substrate 110 and the first substrate 130 be fixed on the fourth substrate 180. At this time, the second insulation layer 170 is located between the fourth substrate 180 and the first insulation layer 140. For example, in the embodiment, the fourth substrate 180 may have an adhesive layer. The fourth substrate 180 may use the adhesive layer to make the second insulation layer 170 and the switch devices 150, the conductive patterns 160, the first insulation layer 140, the light emitting diodes 120, the second substrate 110 and the first substrate 130 fixedly connected with the second insulation layer 170 be fixed on the fourth substrate 180, but the invention is not limited thereto. In the embodiment, the fourth substrate 180 is a transit material, for example. The transit material is silicon oxide ($SiO_2$), alumina ($Al_2O_3$), tantalum oxide ($Ta_2O_5$), ruthenium oxide ($RuO_2$), titanium oxide ($TiO_2$), zirconia ($ZrO_2$), or silicon nitride ($SiN_4$), for example, but the invention is not limited thereto. Referring to FIG. 1F and FIG. 1G, then, the first substrate 130 may be removed to complete the light emitting diode display 100-2. The light emitting diode display 100-2 including at least one light emitting diode chip 10-2 of FIG. 1G further has the second insulation layer 170 and the fourth substrate 180 but without the first substrate 130 compared with the light emitting diode display 100 of FIG. 1D.

Figure 1H:
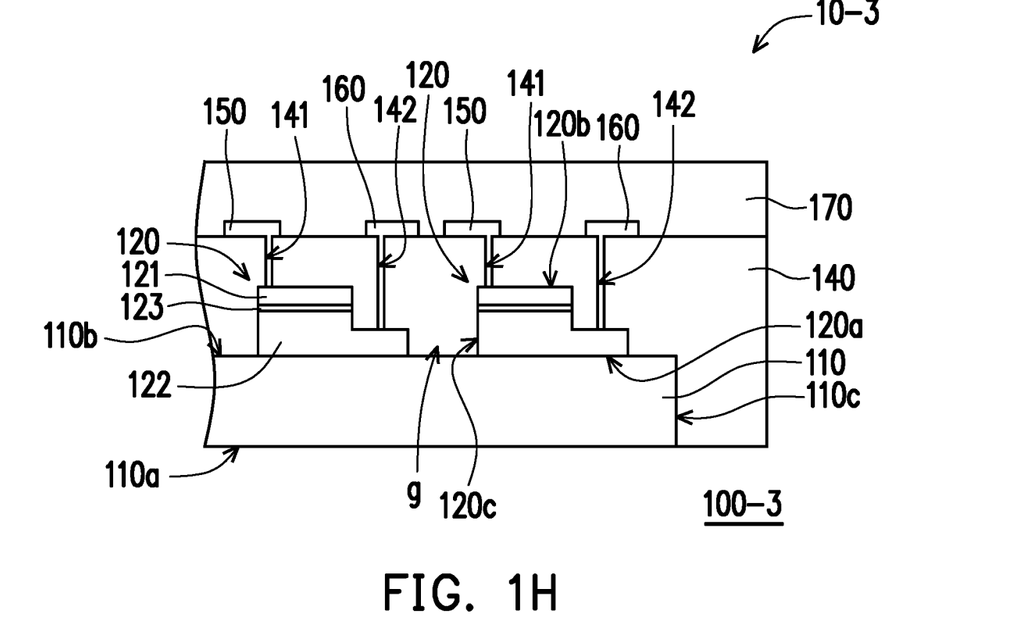

Referring to FIG. 1H, after the light emitting diode display 100-2 of FIG. 1G is completed, furthermore, to make the fourth substrate 180 be separated from the second insulation layer 170 to complete the light emitting diode display 100-3. The light emitting diode display 100-3 including at least one light emitting diode chip 10-3 of FIG. 1H further has the second insulation layer 170 but without the first substrate 130 compared with the light emitting diode display 100 of FIG. 1D.

FIG. 2A to FIG. 2F are schematic cross-sectional views of a fabricating method of a light emitting diode display according to an embodiment of the invention. The fabricating method of a light emitting diode display 100A of FIG. 2A to FIG. 2F is similar to that of the light emitting diode display 100 of FIG. 1A to FIG. 1D. Thus, the same or corresponding components are represented by the same or corresponding reference numbers. The difference between the fabricating method of the light emitting diode display 100A of FIG. 2A to FIG. 2F and that of the light emitting diode display 100 of FIG. 1A to FIG. 1D is that, the fabricating method of the light emitting diode display 100A of FIG. 2A to FIG. 2F further includes the step of removing the second substrate 110. The difference between the two is mainly illustrated in the following, and the same or corresponding positions of the two are referred to the above illustrations.

Figure 2A:
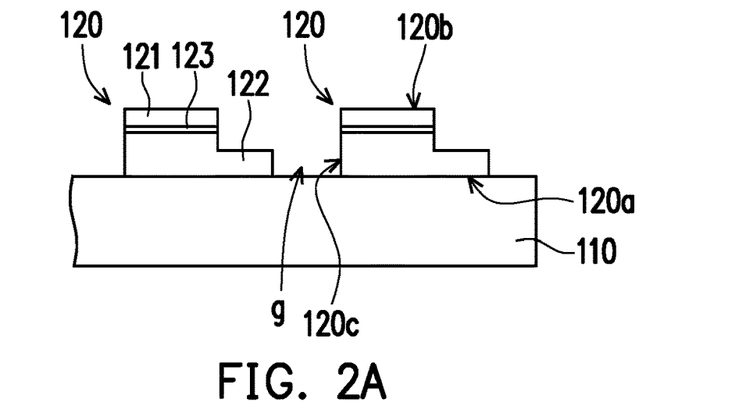
FIG. 2A to FIG. 2F are schematic cross-sectional views of a fabricating method of a light emitting diode display according to an embodiment of the invention.
Figure 2B:
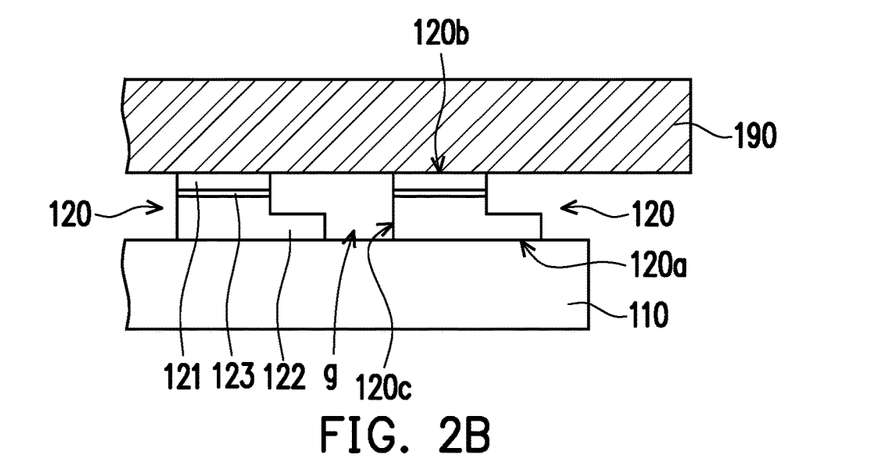
Figure 2C:
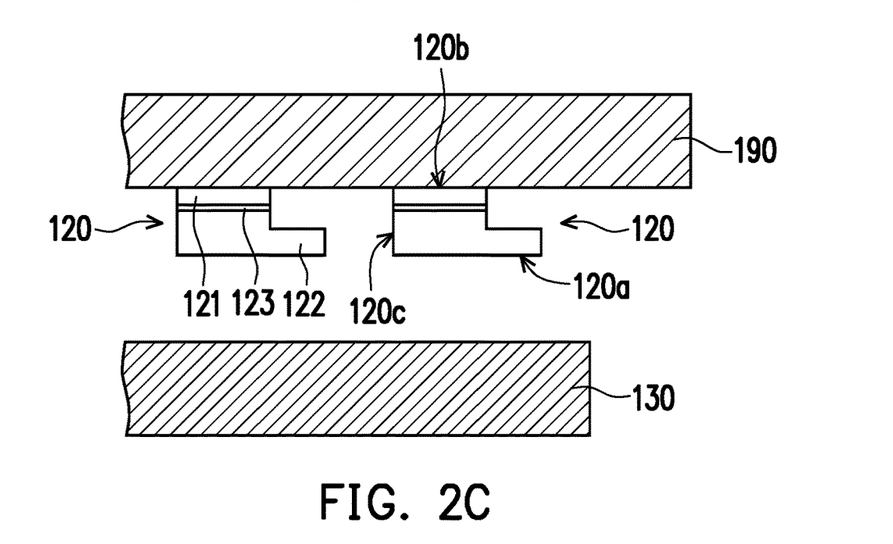
Figure 2D:
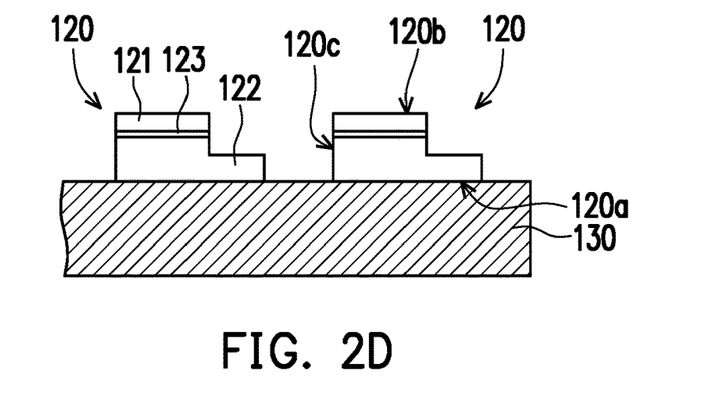

Referring to FIG. 2A, first, the plurality of light emitting diodes 120 are formed on the second substrate 110. Referring to FIG. 2B, then, to make a third substrate 190 pick up the light emitting diodes 120 and the second substrate 110. Referring to FIG. 2B and FIG. 2C, then, the second substrate 110 is removed. For example, in the embodiment, the second substrate 110 may be removed using laser lift-off technology, but the invention is not limited thereto. In other embodiments, the second substrate 110 may also be removed using other appropriate methods (e.g., chemical etching). Referring to FIG. 2C and FIG. 2D, then, to make the third substrate 190 dispose the light emitting diodes 120 on the first substrate 130, and to make the third substrate 190 be separated from the light emitting diodes 120 after the light emitting diodes 120 are disposed at the first substrate 130.

Figure 2E:
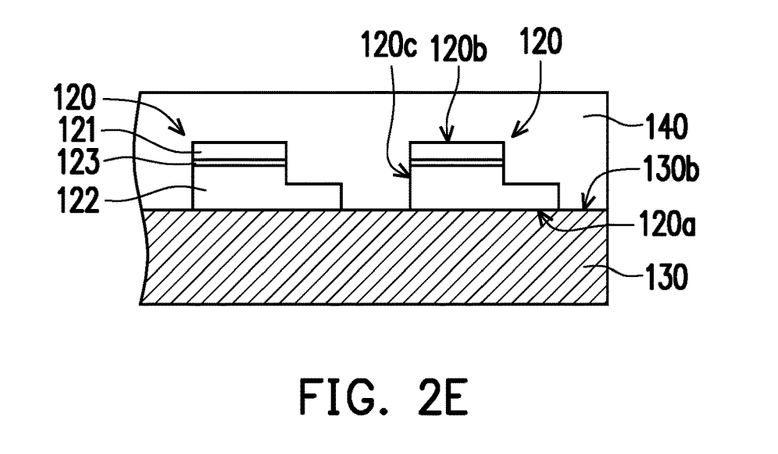
Figure 2F:
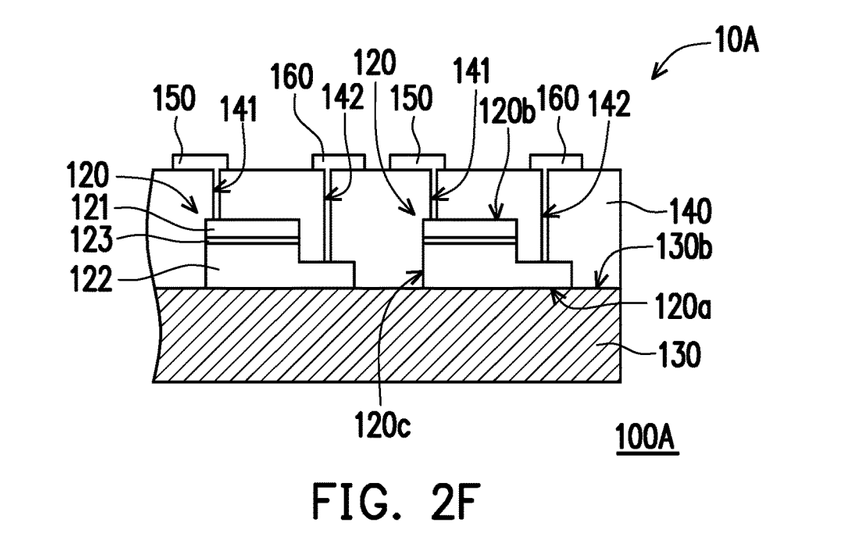

Referring to FIG. 2E, then, the first insulation layer 140 is formed to cover the plurality of light emitting diodes 120. Referring to FIG. 2F, then, the first insulation layer 140 may be patterned to form the plurality of first contact holes 141 and the plurality of second contact holes 142. Referring to FIG. 2F, then, the plurality of switch devices 150 and the plurality of conductive patterns 160 are formed on the first insulation layer 140. The switch devices 150 may be electrically connected to the first type semiconductor layers 121 of the light emitting diodes 120 via the first contact holes 141. The conductive patterns 160 may be electrically connected to the second type semiconductor layers 122 of the light emitting diodes 120 via the second contact holes 142.

After the steps corresponding to FIG. 2A to FIG. 1F are completed, the light emitting diode display 100A including at least one light emitting diode chip 10A is initially completed. The light emitting diode display 100A is similar to the light emitting diode display 100, but the light emitting diode display 100A has no second substrate 110 compared with the light emitting diode display 100. Additionally, it should be note that, the steps corresponding to FIG. 1E, FIG. 1E to FIG. 1G, or FIG. 1E to FIG. 1H may also be performed on the light emitting diode display 100A of FIG. 2F to form the light emitting diode display without the second substrate 110 compared with the light emitting diode displays 100-1, 100-2, or 100-3. These can be implemented by those skilled in the art according to the aforementioned descriptions, and thus will not be further described herein.

Figure 3:
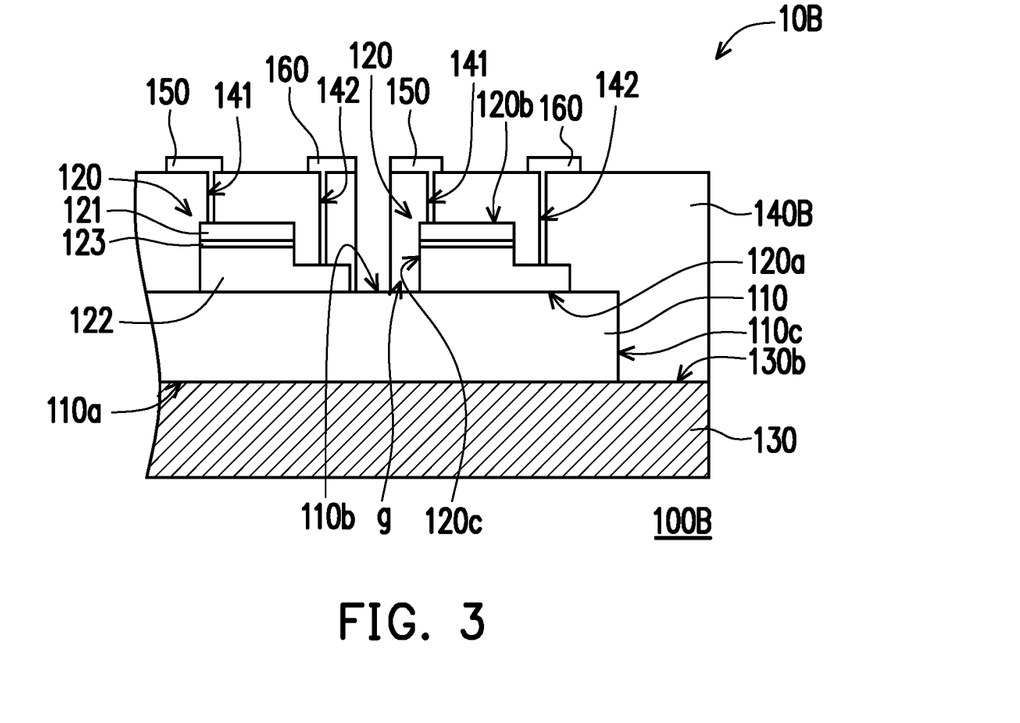
FIG. 3 is a schematic cross-sectional view of a light emitting diode display according to an embodiment of the invention.

FIG. 3 is a schematic cross-sectional view of a light emitting diode display according to an embodiment of the invention. A light emitting diode display 100B of FIG. 3 is similar to the light emitting diode display 100 of FIG. 1D. Thus, the same or corresponding components are represented by the same or corresponding reference numbers. The difference between the light emitting diode display 100B of FIG. 3 and the light emitting diode display 100 of FIG. 1D is that, a first insulation layer 140B of the light emitting diode display 100B is different from the first insulation layer 140 of the light emitting diode display 100. The difference between the two is mainly illustrated in the following, and the same or corresponding positions of the two are referred to the above illustrations.

The light emitting diode display 100B includes at least one light emitting diode chip 10B. Each of the light emitting diode chips 10B includes the first substrate 130, the plurality of light emitting diodes 120 disposed on the first substrate 130, the first insulation layer 140B covering the plurality of light emitting diodes 120 and the plurality of switch devices 150 disposed on the first insulation layer 140B and electrically connected to the light emitting diodes 120. Unlike the light emitting diode display 100, the first insulation layer 140B does not completely cover the first substrate 130 and the second substrate 110. The first insulation layer 140B may partially cover the first substrate 130 and the second substrate 110. For example, in the embodiment, two adjacent light emitting diodes 120 has the gap g therebetween. The gap g exposes a portion of the upper surface 110b of the second substrate 110. The first insulation layer 140B covers the plurality of light emitting diodes 120 and may uncover a portion of the upper surface 110b of the second substrate 110, but the invention is not limited thereto.

Figure 4:
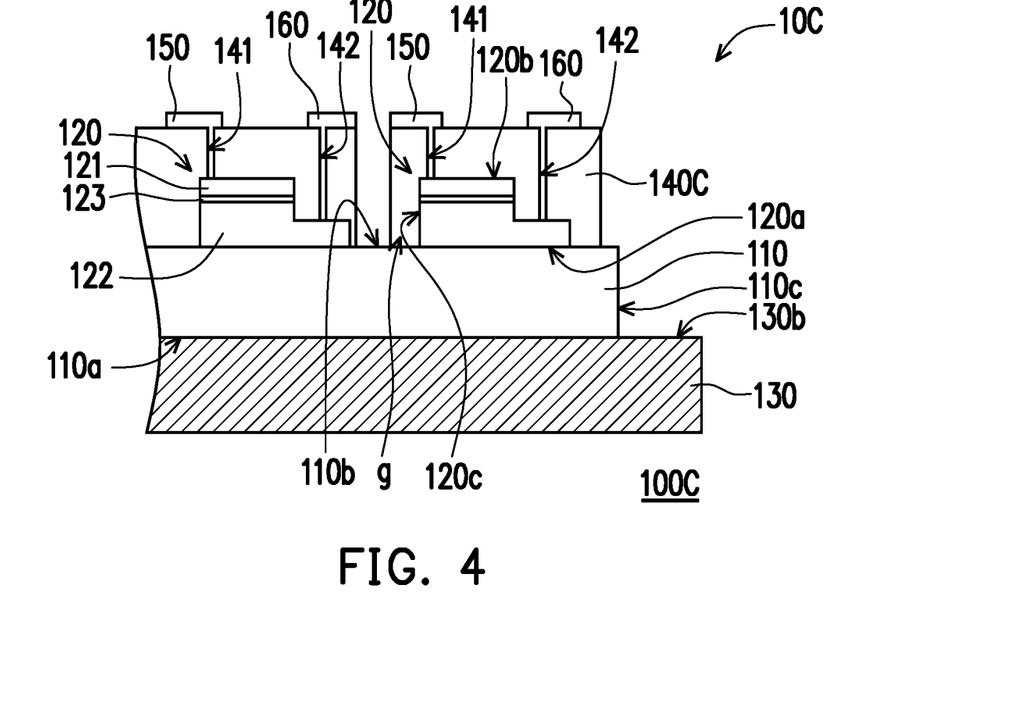
FIG. 4 is a schematic cross-sectional view of a light emitting diode display according to an embodiment of the invention.

FIG. 4 is a schematic cross-sectional view of a light emitting diode display according to an embodiment of the invention. A light emitting diode display 100C of FIG. 4 is similar to the light emitting diode display 100 of FIG. 1D. Thus, the same or corresponding components are represented by the same or corresponding reference numbers. The difference between the light emitting diode display 100C of FIG. 4 and the light emitting diode display 100 of FIG. 1D is that, a first insulation layer 140C of the light emitting diode display 100C is different from the first insulation layer 140 of the light emitting diode display 100. The difference between the two is mainly illustrated in the following, and the same or corresponding positions of the two are referred to the above illustrations.

The light emitting diode display 100C includes at least one light emitting diode chip 10C. Each of the light emitting diode chips 10C includes the first substrate 130, the plurality of light emitting diodes 120 disposed on the first substrate 130, the first insulation layer 140C covering the plurality of light emitting diodes 120 and the plurality of switch devices 150 disposed on the first insulation layer 140C and electrically connected to the light emitting diodes 120. Unlike the light emitting diode display 100, the first insulation layer 140C does not completely cover the first substrate 130 and the second substrate 110. The first insulation layer 140C may partially cover the first substrate 130 and the second substrate 110. For example, in the embodiment, two adjacent light emitting diodes 120 has the gap g therebetween. The gap g exposes a portion of the upper surface 110b of the second substrate 110. The first insulation layer 140C covers the plurality of light emitting diodes 120 and may uncover a portion of the upper surface 110b of the second substrate 110 and the sidewall 110C of the second substrate 110, but the invention is not limited thereto.

Figure 5:
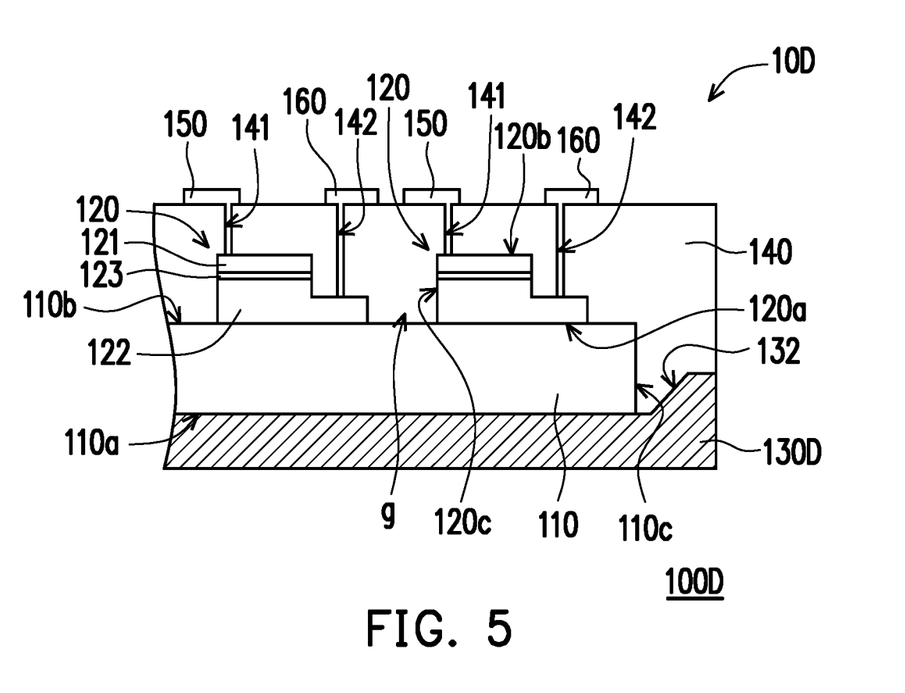
FIG. 5 is a schematic cross-sectional view of a light emitting diode display according to an embodiment of the invention.

FIG. 5 is a schematic cross-sectional view of a light emitting diode display according to an embodiment of the invention. A light emitting diode display 100D of FIG. 5 is similar to the light emitting diode display 100 of FIG. 1D. Thus, the same or corresponding components are represented by the same or corresponding reference numbers. The difference between the light emitting diode display 100D of FIG. 5 and the light emitting diode display 100 of FIG. 1D is that, a first substrate 130D of the light emitting diode display 100D is different from the first substrate 130 of the light emitting diode display 100. The difference between the two is mainly illustrated in the following, and the same or corresponding positions of the two are referred to the above illustrations.

The light emitting diode display 100D includes at least one light emitting diode chip 10D. Each of the light emitting diode chips 10D includes the first substrate 130D, the plurality of light emitting diodes 120 disposed on the first substrate 130D, the first insulation layer 140 covering the plurality of light emitting diodes 120 and the plurality of switch devices 150 disposed on the first insulation layer 140 and electrically connected to the light emitting diodes 120. Unlike the light emitting diode display 100, the first substrate 130D has a groove 132, and the light emitting diodes 120 are disposed in the groove 132. Furthermore, in the manufacturing process of the light emitting diode display 100D, the second substrate 110 is retained, and the second substrate 110 and the light emitting diodes 120 disposed on the second substrate 110 may be disposed in the groove 132 together. However, the invention is not limited thereto. In other embodiments, if the second substrate 110 is removed, the light emitting diodes 120 may be directly disposed in the groove 132.

Figure 6:
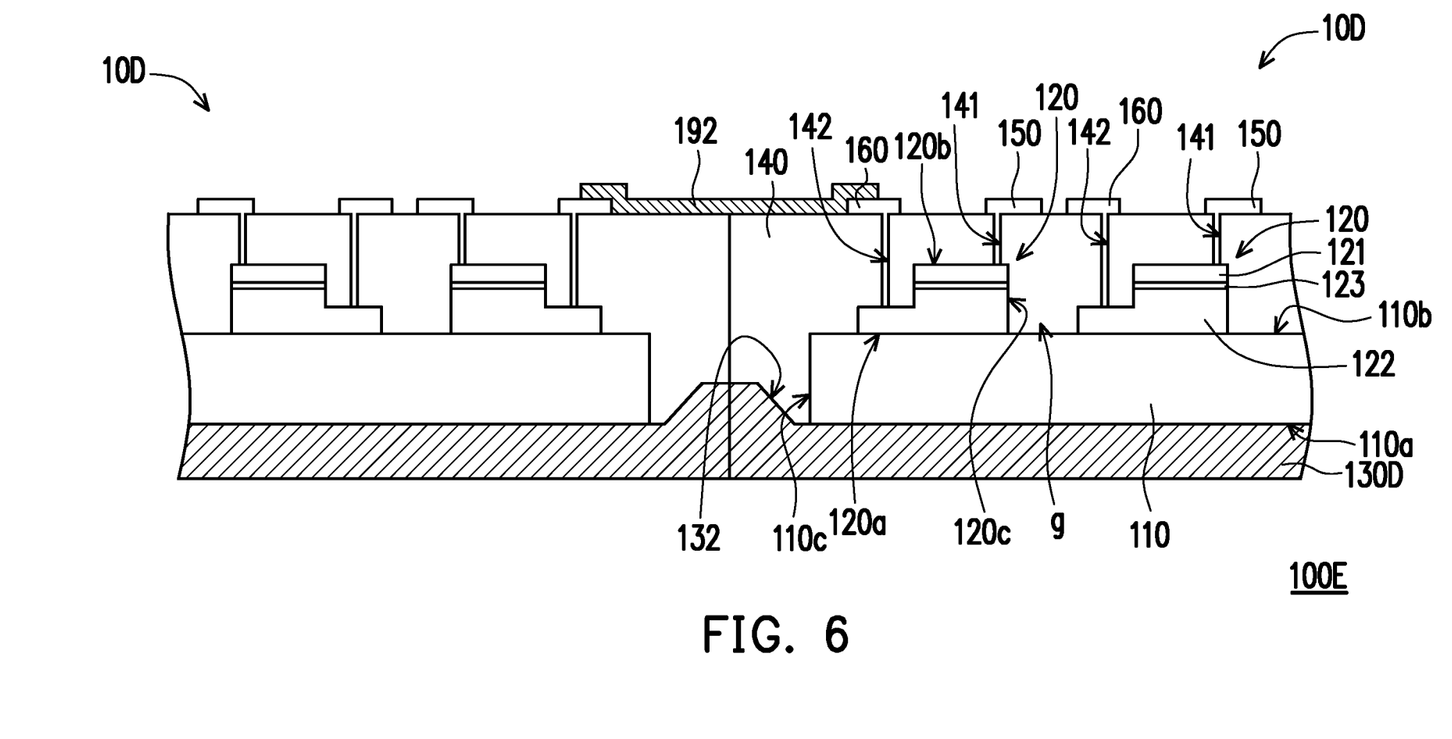
FIG. 6 is a schematic cross-sectional view of a light emitting diode display according to an embodiment of the invention.

FIG. 6 is a schematic cross-sectional view of a light emitting diode display according to an embodiment of the invention. A light emitting diode display 100E of FIG. 6 is similar to light emitting diode display 100D of FIG. 5. Thus, the same or corresponding components are represented by the same or corresponding reference numbers. The difference between the light emitting diode display 100E of FIG. 6 and the light emitting diode display 100D of FIG. 5 is that, the light emitting diode display 100E may include a plurality of light emitting diode chips 10D to form a light emitting diode display with a large display area. Furthermore, the light emitting diode display 100E not only includes the plurality of light emitting diode chips 10D, but also includes a conductive wire 192 disposed on the first insulation layer 140. The conductive wire 192 is disposed on the first insulation layer 140 and electrically connected between two adjacent light emitting diode chips 10D.

In summary, the fabricating method of the light emitting diode display according to an embodiment of the invention includes the following steps. The insulation layer is formed on the substrate carrying the plurality of light emitting diodes to cover the plurality of light emitting diodes. Then, the plurality of switch devices electrically connected to the plurality of light emitting diodes are formed on the insulation layer. Thus, the light emitting diodes are not required to be transferred onto the drive circuit substrate with the switch device, thereby enhancing the yield of the light emitting diode display.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A fabricating method of a light emitting diode display, comprising:
    forming a plurality of light emitting diodes on a first substrate;
    making a second substrate pick up the light emitting diodes and the first substrate;
    removing the first substrate;
    making the second substrate dispose the light emitting diodes on a third substrate;
    forming a first insulation layer to cover the light emitting diodes; and
    forming a plurality of switch devices on the first insulation layer, wherein the switch devices are electrically connected to the light emitting diodes;
    forming a second insulation layer to cover the switch devices;
    making the second insulation layer, the switch devices, the first insulation layer, the light emitting diodes and the third substrate be fixed on a fourth substrate, wherein the second insulation layer is located between the fourth substrate and the first insulation layer; and
    removing the third substrate.

2. The fabricating method of the light emitting diode display according to claim 1, further comprising:
    after removing the third substrate, making the fourth substrate be separated from the second insulation layer.

3. A fabricating method of a light emitting diode display, comprising:
    providing a first substrate and a plurality of light emitting diodes disposed on the first substrate;
    forming a first insulation layer to cover the light emitting diodes;
    forming a plurality of switch devices on the first insulation layer, wherein the switch devices are electrically connected to the light emitting diodes;
    forming a second insulation layer to cover the switch devices;
    making the second insulation layer, the switch devices, the first insulation layer, the light emitting diodes and the first substrate be fixed on a second substrate, wherein the second insulation layer is located between the second substrate and the first insulation layer; and
    removing the first substrate;
    after removing the first substrate, making the second substrate be separated from the second insulation layer.

* * * * *